(12) United States Patent
Spataro et al.

(10) Patent No.: US 11,901,863 B2
(45) Date of Patent: Feb. 13, 2024

(54) CAPACITIVELY-COUPLED STACKED CLASS-D OSCILLATORS FOR GALVANIC ISOLATION

(71) Applicants: STMicroelectronics S.r.l., Agrate Brianza (IT); Università degli studi di Catania, Catania (IT)

(72) Inventors: Simone Spataro, Calatabiano (IT); Salvatore Coffa, Milan (IT); Egidio Ragonese, Aci Catena (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

(21) Appl. No.: 18/177,533

(22) Filed: Mar. 2, 2023

(65) Prior Publication Data

US 2023/0353091 A1   Nov. 2, 2023

Related U.S. Application Data

(63) Continuation of application No. 17/732,026, filed on Apr. 28, 2022, now Pat. No. 11,621,670.

(51) Int. Cl.
*H03B 5/12*    (2006.01)
*H03K 3/011*   (2006.01)
*H03K 3/0231*  (2006.01)

(52) U.S. Cl.
CPC ......... *H03B 5/1228* (2013.01); *H03B 5/1253* (2013.01); *H03K 3/011* (2013.01); *H03K 3/0231* (2013.01); *H03B 2200/0062* (2013.01)

(58) Field of Classification Search
CPC .... H03K 3/0231; H03K 3/011; H03B 5/1228; H03B 2200/0062; H03B 5/1253
USPC ........................................ 331/167, 117 FE, 2
See application file for complete search history.

(56) References Cited

U.S. PATENT DOCUMENTS

| | | | |
|---|---|---|---|
| 7,239,209 B2 | 7/2007 | Adan | |
| 7,295,076 B2 | 11/2007 | Kim et al. | |
| 9,240,752 B2 | 1/2016 | Ragonese et al. | |
| 9,520,828 B2 | 12/2016 | Ragonese et al. | |
| 9,673,754 B2 | 6/2017 | Ragonese et al. | |
| 11,621,670 B1 * | 4/2023 | Spataro ............... | H03B 5/1228 331/111 |
| 2008/0007366 A1 | 1/2008 | Bevilacqua et al. | |

* cited by examiner

*Primary Examiner* — Arnold M Kinkead
(74) *Attorney, Agent, or Firm* — Slater Matsil, LLP

(57) ABSTRACT

An oscillator circuit includes a total of N (N≥2) class-D oscillator circuits stacked together between a supply voltage node and a reference voltage node. The output ports of adjacent class-D oscillator circuits in the disclosed oscillator circuit are coupled together by capacitors to ensure frequency and phase synchronization for the frequency signals generated by the class-D oscillator circuits. Compared with a reference oscillator circuit formed of a single class-D oscillator circuit, the oscillation amplitude of each of the class-D oscillator circuits in the disclosed oscillator circuit is 1/N of that of the reference oscillator circuit, and the current consumption of the disclosed oscillator circuit is 1/N of that of the reference oscillator circuit.

20 Claims, 10 Drawing Sheets

CAPACITIVELY-COUPLED STACKED CLASS-D OSCILLATORS FOR GALVANIC ISOLATION

PRIORITY CLAIM AND CROSS-REFERENCE

This application is a continuation of U.S. patent application Ser. No. 17/732,026, filed on Apr. 28, 2022 and entitled "Capacitively-Coupled Stacked Class-D Oscillators for Galvanic Isolation," which application is incorporated herein by reference.

TECHNICAL FIELD

The present invention relates generally to electronic circuits, and, in particular embodiments, to oscillator circuits suitable for galvanic isolation in semiconductor packages.

BACKGROUND

Galvanic isolation techniques are commonly used in electrical systems to improve the safety and reliability for various applications (e.g., industrial sensors, medical equipment, gate drivers for motor control, etc.). Generally, a galvanically isolated system includes two power domains that are galvanically isolated because, e.g., one of the power domains is subject to hazardous voltages, or the power domains have different ground references. Galvanic isolation is typically used to isolate the different power domains to prevent current flow between the isolated power domains. Energy or information can still be exchanged between the isolated power domain by other means, such as capacitive, inductive, or optical means.

An important performance parameter for galvanic isolation is the maximum surge isolation voltage $V_{SURGE}$. The maximum surge isolation voltage $V_{SURGE}$ quantifies the capability of the isolator to withstand very high voltage impulses of a certain transient profile, which may arise from direct or indirect lightning strikes, faults, or short-circuit events. The highest level of isolation, namely reinforced isolation, is certified if a single isolation barrier passes a 10-kV surge test. Another important parameter for galvanic isolation is the common-mode transient immunity (CMTI), which measures the capability of the isolation device to withstand rapid shifts of grounds (e.g., high dV/dt), and whose typical values range from 50 kV/μs to 200 kV/μs. Typically, the CMTI performance is related to the parasitic capacitive effects of the galvanic barrier. It is advantageous for galvanic isolation to improve the isolation rating while still maintaining competitive performance in terms of data rate and CMTI.

In the near future, application fields such as industrial, automotive, or medical field, may demand $V_{SURGE}$ up to 20 kV. Moreover, the higher switching frequencies enabled by wideband power devices, such as gallium nitride high-electron-mobility transistors (GaN HEMT) and silicon carbide (SiC) MOSFETs, may require a CMTI beyond 200 kV/μ. Traditional chip-scale isolators, where galvanic isolation is achieved by separating different power domains using one or more dielectric layers of a semiconductor chip, are based on capacitors, transformers, or LC hybrid networks, which exploit, e.g., thick silicon dioxide or polyimide layers as an isolation barrier. These approaches have inherent limitations in terms of both isolation rating and CMTI due to the maximum manufacturable dielectric thickness and related capacitive parasitics, respectively. There is a need in the art for galvanic isolation techniques with improved isolation rating and CMTI performance.

SUMMARY

In some embodiments, an apparatus includes a first oscillator circuit and a second oscillator circuit. The first oscillator circuit comprises: a first transistor and a second transistor, wherein a gate terminal of the first transistor and a gate terminal of the second transistor are coupled to a first node, wherein a first load path terminal of the first transistor and a first load path terminal of the second transistor are coupled to a reference voltage node; a first coil coupled between a second load path terminal of the first transistor and a second load path terminal of the second transistor; and a first capacitor coupled in parallel with the first coil. The second oscillator circuit comprises: a third transistor and a fourth transistor, wherein a gate terminal of the third transistor and a gate terminal of the fourth transistor are coupled to a second node, wherein a first load path terminal of the third transistor and a first load path terminal of the fourth transistor are coupled to a center tap of the first coil; a second coil coupled between a second load path terminal of the third transistor and a second load path terminal of the fourth transistor; and a second capacitor coupled in parallel with the second coil. The apparatus further includes: a third capacitor coupled between the second load path terminal of the first transistor and the second load path terminal of the third transistor; and a fourth capacitor coupled between the second load path terminal of the second transistor and the second load path terminal of the fourth transistor.

In some embodiments, a device includes a first oscillator circuit and a second oscillator circuit concatenated with the first oscillator circuit, wherein the first oscillator circuit and the second oscillator circuit are configured to be coupled between a supply voltage and an electrical ground, wherein each of the first oscillator circuit and the second oscillator circuit is a class-D oscillator circuit, wherein the class-D oscillator circuit comprises: a first transistor coupled between a reference voltage node of the class-D oscillator circuit and a first output of the class-D oscillator circuit; a second transistor coupled between the reference voltage node of the class-D oscillator circuit and a second output of the class-D oscillator circuit, wherein a gate terminal of the first transistor and a gate terminal of the second transistor are coupled to a bias voltage node of the class-D oscillator circuit; a first coil coupled between the first output and the second output of the class-D oscillator circuit; and a first capacitor coupled in parallel with the first coil. The device further includes: a second capacitor coupled between the first output of the first oscillator circuit and the first output of the second oscillator circuit; and a third capacitor coupled between the second output of the first oscillator circuit and the second output of the second oscillator circuit.

In some embodiments, an integrated circuit (IC) device includes a first oscillator circuit that comprises: a first transistor and a second transistor, wherein a gate terminal of the first transistor is coupled to a first node through a first resistor, and a gate terminal of the second transistor is coupled to the first node through a second resistor; a first capacitor coupled between a drain terminal of the first transistor and a drain terminal of the second transistor; and a first coil coupled in parallel with the first capacitor. The IC device further includes a second oscillator circuit, wherein the second oscillator circuit is identical to the first oscillator circuit, wherein a source terminal of the first transistor of the first oscillator circuit and a source terminal of the second transistor of the first oscillator circuit are coupled to a reference voltage node, wherein a source terminal of the first transistor of the second oscillator circuit and a source terminal of the second transistor of the second oscillator circuit are coupled to a center tap of the first coil of the first oscillator circuit, wherein a center tap of the first coil of the second oscillator circuit is coupled to a supply voltage node. The IC device further includes: a second capacitor coupled between the drain terminal of the first transistor of the first oscillator circuit and the drain terminal of the first transistor of the second oscillator circuit; and a third capacitor coupled between the drain terminal of the second transistor of the first oscillator circuit and the drain terminal of the second transistor of the second oscillator circuit.

BRIEF DESCRIPTION OF THE DRAWINGS

The details of one or more embodiments of the invention are set forth in the accompanying drawings and the description below. Other features, objects, and advantages of the invention will be apparent from the description and drawings, and from the claims. In the figures, identical reference symbols generally designate the same component parts throughout the various views, which will generally not be re-described in the interest of brevity. For a more complete understanding of the invention, reference is now made to the following descriptions taken in conjunction with the accompanying drawings, in which:

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention. In the discussion herein, "coupled" is used to refer electrical coupling unless otherwise specified, and the term "coupled" is used to describe electrical connections where a first electrical component is directly, or indirectly, coupled to a second electrical component, while the term "directly coupled" is used to describe a direct electrical connection (e.g., via a copper line) between a first electrical component and a second electrical component without an intervening electrical component.

The present invention will be described in the context of semiconductor packages with package-scale galvanic isolation, and in particular embodiments, oscillator circuits suitable for use in the semiconductor packages with package-scale galvanic isolation.

Figure 1:
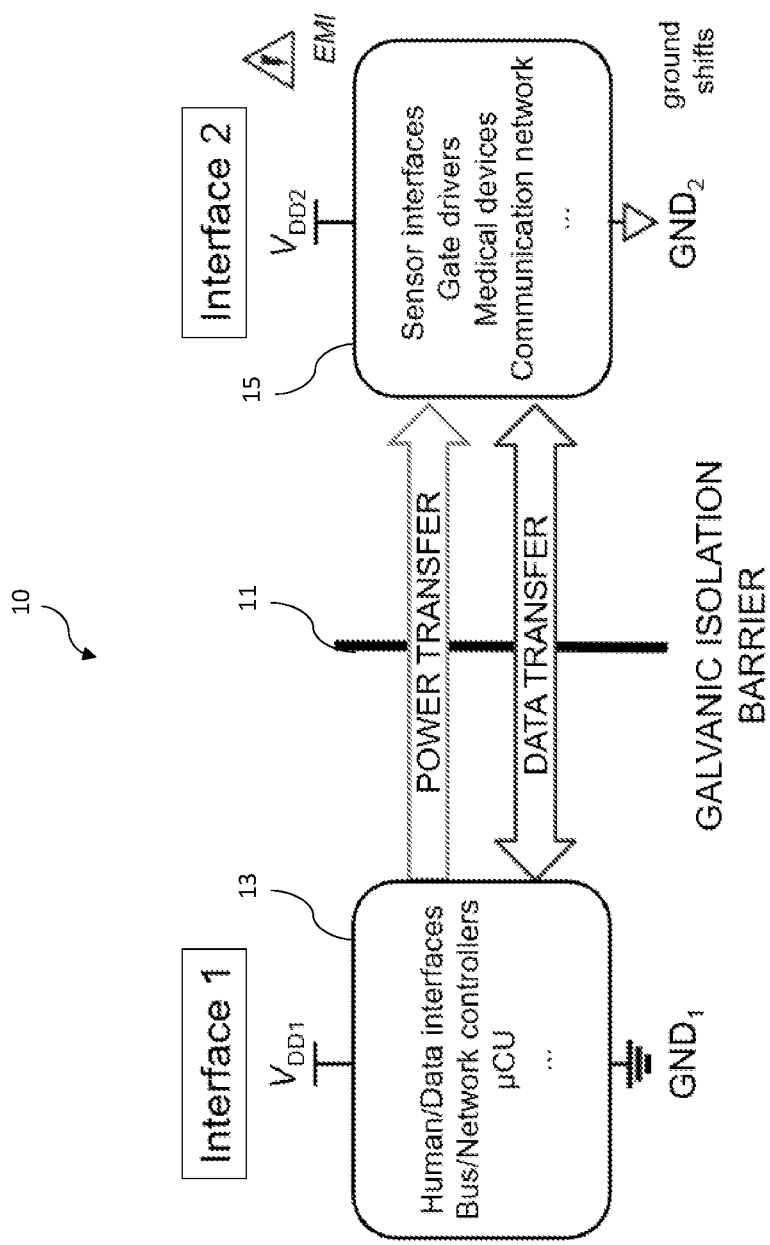
FIG. 1 illustrates a block diagram of an electrical system with galvanic isolation, in an embodiment.

FIG. 1 illustrates a block diagram of an electrical system 10 with galvanic isolation, in an embodiment. The electrical system 10 in FIG. 1 includes a first circuit 13 in a first power domain, e.g., having a first supply voltage (e.g., $V_{DD1}$) and a first electrical ground level (e.g., $GND_1$), and includes a second circuit 15 in a second power domain, e.g., having a second supply voltage (e.g., $V_{DD2}$) and a second electrical ground level (e.g., $GND_2$). The electrical system 10 further includes a galvanic isolation barrier 11 between the first circuit 13 and the second circuit 15.

Galvanic isolation is generally used in electrical systems for isolating functional sections (e.g., 13 and 15) of the electrical systems to prevent current flow between the isolated functional sections. Energy or information can still be exchanged between the sections by other means, such as capacitive, inductive, electromagnetic, optical, acoustic, or mechanical means. Galvanic isolation may be used where two or more electric circuits (e.g., 13 and 15) need to communicate with each other, but their grounds may be at different potentials. Galvanic isolation may also be used for safety purposes, e.g., to decouple a function block from another block connected to the power grid or other high voltage, for safety and equipment protection.

Figure 2:
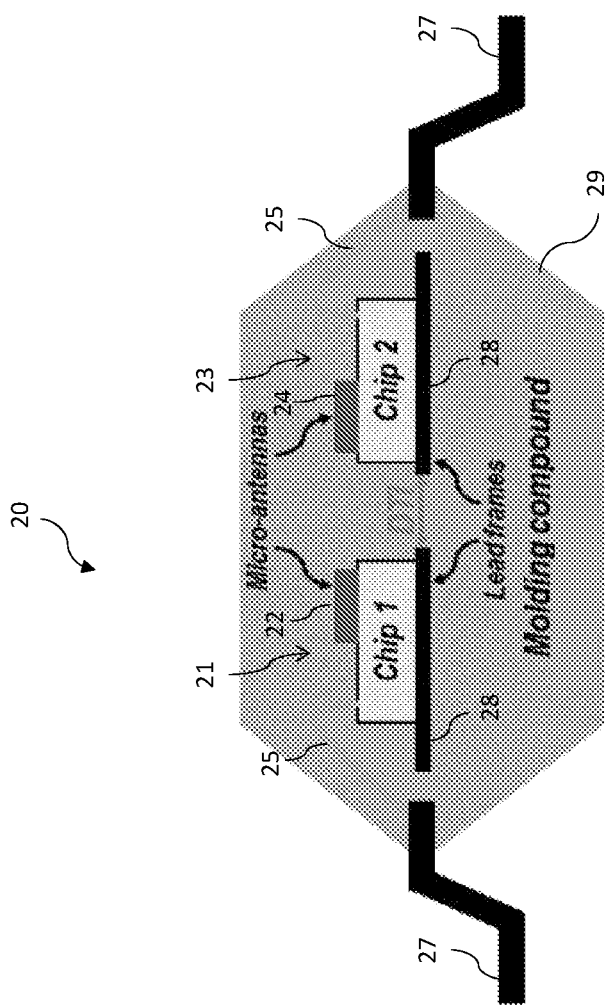
FIG. 2 illustrates a cross-sectional view of a semiconductor package with package-scale galvanic isolation, in an embodiment.

FIG. 2 illustrates a cross-sectional view of a semiconductor package 20 with package-scale galvanic isolation, in an embodiment. The semiconductor package 20 forms a galvanically isolated system by using standard packaging/assembling techniques along with radio frequency (RF) coupling between the micro-antennas of two side-by-side co-packaged semiconductor chips (may also be referred to as chips, or integrate-circuit (IC) chips). By exploiting the near-field coupling between the micro-antennas integrated on two side-by-side co-packaged chips, standard molding compound is used as the isolation barrier.

Figure 8:
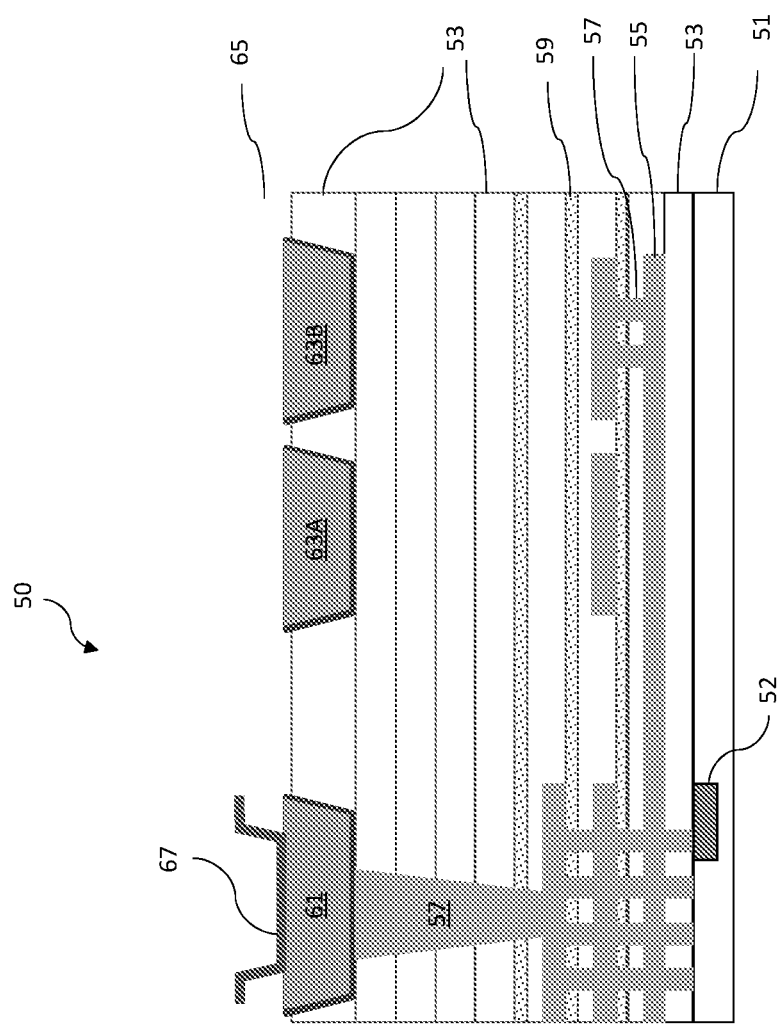
FIG. 8 illustrates a cross-sectional view of a semiconductor chip, in an embodiment.

As illustrated in FIG. 2, the semiconductor package 20 includes a chip 21 attached to a lead frame 28. Conductive pads of the chip 21 are coupled to input/output (I/O) pins 27 of the semiconductor package 20 using bond wires 25. The semiconductor package 20 further includes a chip 23 attached to another lead frame 28 and coupled to its respective I/O pins 27 by bond wires 25. The chip 21 and the chip 23 are disposed next to each other (e.g., side-by-side). A distance between the chips 21 and 23, also referred to as distance through insulator (DTI), may be, e.g., hundreds of microns. As illustrated in FIG. 2, micro-antennas 22 and 24 are formed on the chips 21 and 23, respectively. Each of the micro-antennas 22 and 24 is electrically coupled to a respective chip (e.g., 21 or 23), and is used to transmit and/or receive an RF signal for data communication between the chips 21 and 23. A molding compound 29 is formed to encapsulate the chips 21 and 23, the lead frames 28, the micro-antennas 22 and 24, and the bond wires 25. In some embodiments, the micro-antennas 22 and 24 are pre-formed before being attached to the surfaces of the chips 21 and 23. In some embodiments, the micro-antennas 22 and 24 are formed as part of the chips 21 and 23 during the semiconductor manufacturing process to form the chips 21 and 23. For example, FIG. 8 shows micro-antennas 63A and 63B being formed within an upper dielectric layer 53 of a chip 50. More details of FIG. 8 are discussed hereinafter.

One of the advantages of package-scale galvanic isolation is the use of the molding compound 29 as an isolation layer between two side-by-side co-packaged chips 21 and 23 along with a wider DTI (typically hundreds of microns between the chip lead frames 28) to achieve increased isolation rating while reducing the capacitive parasitics of the galvanic barrier. The physical channel for data communication exploits the weak near-field electromagnetic (EM) coupling (e.g., RF coupling) between the micro-antennas 22 and 24 integrated on the side-by-side co-packaged chips, as shown in FIG. 2. In this approach, the DTI is chosen to guarantee the required isolation rating, while at the same time ensuring a reasonable coupling level between the micro-antennas 22 and 24. For example, standard molding compounds exhibit dielectric strength ($E_M$) of about 50-100 kV/mm, thus enabling reinforced isolation (e.g., $V_{SURGE} \geq 10$ kV) with a DTI of just 200 µm, which produces very low capacitive parasitics and hence CMTI better than, e.g., 200 kV/µs.

Package-scale galvanic isolation based on RF coupling has other advantages compared to traditional isolation approaches. For example, a customized technology/component is not required for package-scale galvanic isolation, and standard packaging is sufficient to guarantee outstanding isolation and CMTI performance. Moreover, the approach is highly flexible and can be tailored to the application specifications without time-consuming and expensive technology development. Such advantages, however, are achieved with a larger silicon area consumption due to on-chip antennas (e.g., micro-antennas) on both chips. The RF coupling isolation approach of FIG. 2 is suited for data transmission. In particular, due to high isolation channel loss (e.g., RF coupling loss of 40 dB or larger), carrier-based modulation is used to enable CMTI performance better than 200 kV/µs with a higher power consumption compared to the impulsive modulation approaches used in chip-scale insulation schemes.

Figure 3:
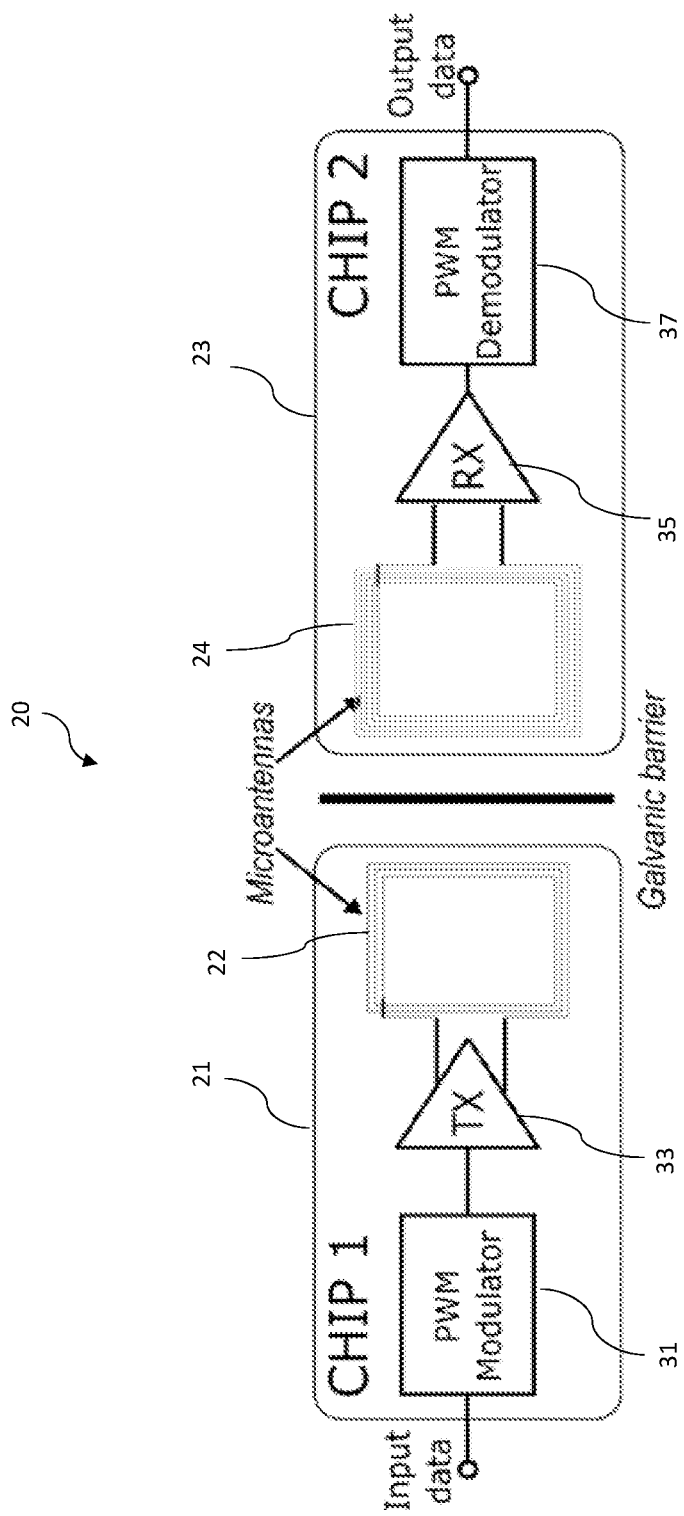
FIG. 3 illustrates a system block diagram of the semiconductor package of FIG. 2, in an embodiment.

FIG. 3 illustrates a system block diagram of the semiconductor package 20 of FIG. 2, in an embodiment. The semiconductor package 20 includes the semiconductor chip 21 and the semiconductor chip 23. The semiconductor chip 21 includes a modulator 31 (e.g., a pulse-width modulation (PWM) modulator), a transmit (Tx) circuit 33, and the micro-antenna 22 for transmitting the modulated RF signals. In some embodiments, the Tx circuit 33 includes an oscillator circuit, and the micro-antenna 22 is an inductive component (e.g., a coil) that forms an LC tank circuit with a capacitor of the Tx circuit 33 to generate an RF signal for transmission. Therefore, the micro-antenna 22 may be a part of the oscillator circuit. In some embodiments, the oscillator circuit in the Tx circuit 33 is turned on and off by the PWM digital stream produced by the PWM modulator 31. Note that although the micro-antenna 22 is shown as one coil in the block diagram of FIG. 3, the micro-antenna 22 may be implemented as multiple coils in an oscillator circuit.

The semiconductor chip 23 includes the micro-antenna 24 for receiving the transmitted RF signal from the micro-antenna 22. The semiconductor chip 23 further includes a receive (Rx) circuit 35 which may include rectifiers, amplifiers, filters, or the like, and a demodulator 37 (e.g., a PWM demodulator) for demodulating the received signal. In some embodiments, the micro-antenna 24, which is weakly coupled to the micro-antenna 22, outputs a magnetically induced RF voltage. After being rectified by a rectifier in the Rx circuit 35, the envelope of the received RF voltage is further amplified by an amplifier (e.g., a gain stage) of the Rx circuit 35, and drives a hysteresis comparator of the Rx circuit 35 to reconstruct the transmitted PWM signal. Finally, a baseband PWM demodulator (e.g., 37) is used to recover the original digital bit stream. Due to the high channel loss (about 30-45 dB depending on the adopted technology and chip distance), the system is operated in narrowband mode with both micro-antennas 22 and 24 resonating at the RF carrier frequency $f_{RF}$.

Figure 4:
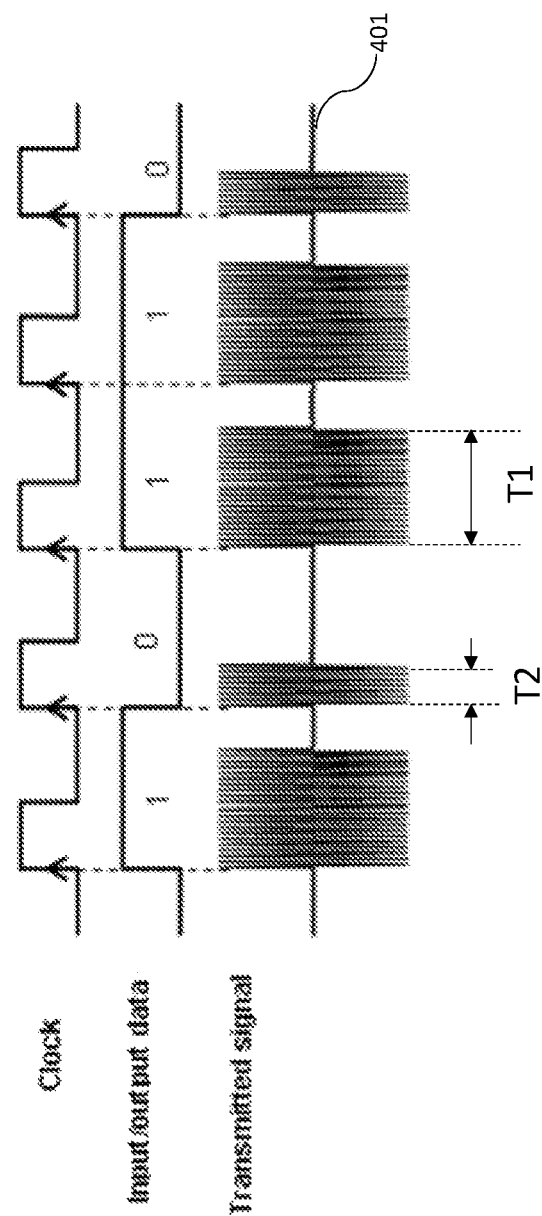
FIG. 4 illustrates an on-off keying pulse-width modulated (OOK PWM) signal, in an embodiment.

FIG. 4 illustrates an on-off keying pulse-width modulated (OOK PWM) signal 401, in an embodiment. The OOK PWM signal 401 is the RF signal transmitted or received by the micro-antennas 22 and 24, in some embodiments. FIG. 4 further illustrates an example input/output data sequence, and the clock signal for the input/output data sequence. In the example of FIG. 4, for a bit of "1," the PWM modulator 31 (see FIG. 3) controls the Tx circuit 33 to generate the OOK PWM signal 401 with a duration of T1; and for a bit of "0," the PWM modulator 31 controls the Tx circuit 33 to generate the OOK PWM signal 401 with a duration of T2, which is shorter than T1. In other words, the digital information (e.g., 1 or 0) is encoded in the length (e.g., duration) of the OOK PWM signal 401 for each bit, instead of the amplitude of the OOK PWM signal. This improves the robustness of the RF signal against interferences and noises in the communication channel. The data rate achievable by the semiconductor package 20 using the OOK PWM signal may be between, e.g., about 100 Mbits/s and about 500 Mbits/s.

Figure 5:
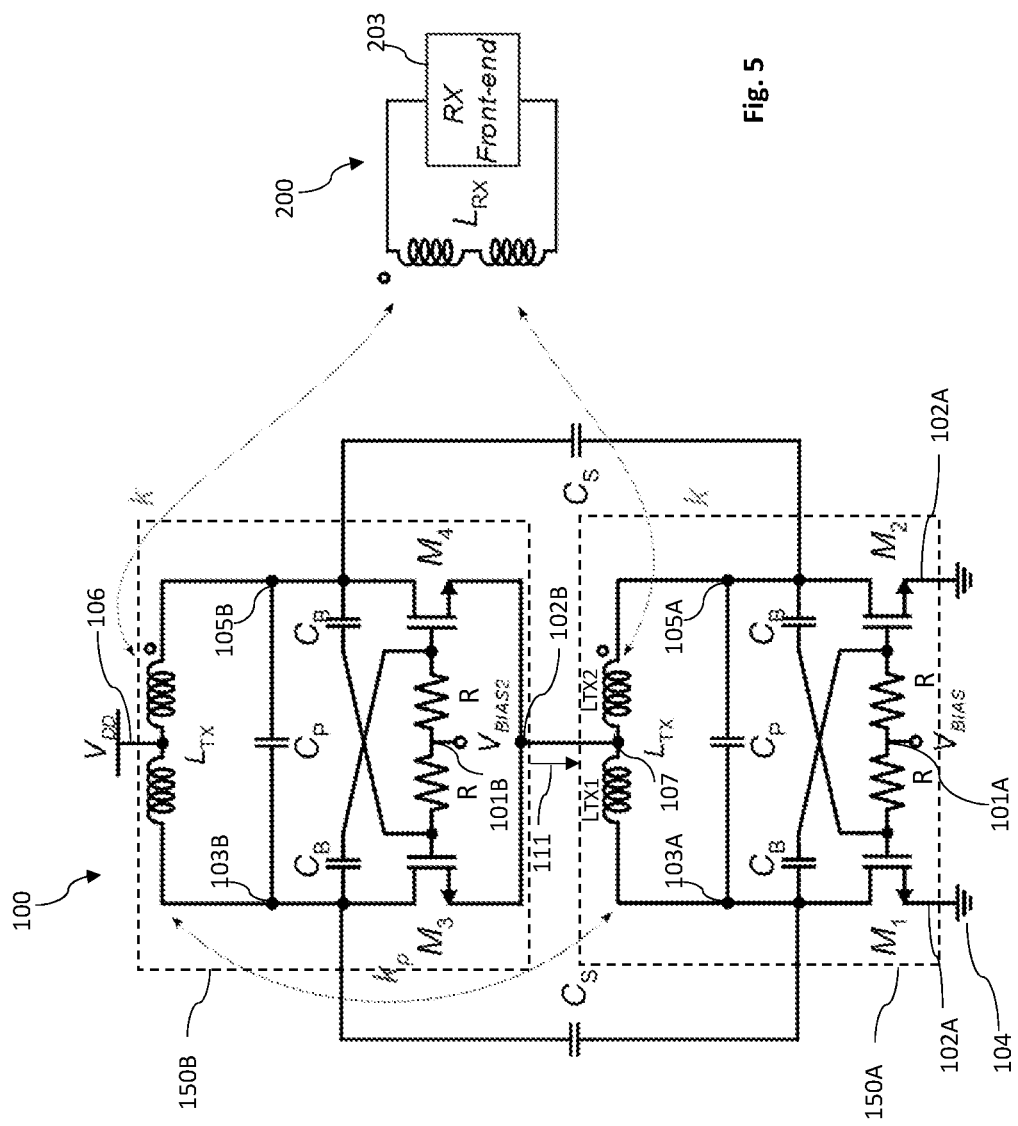
FIG. 5 is a schematic diagram of an oscillator circuit, in an embodiment.

FIG. 5 is a schematic diagram of an oscillator circuit 100, in an embodiment. The oscillator circuit 100 corresponds to the combination of the Tx circuit 33 and the micro-antenna 22 in FIG. 3, in some embodiments. FIG. 5 further illustrates an Rx circuit 200 that is coupled to the oscillator circuit 100. The Rx circuit 200 includes an inductive component $L_{RX}$ (e.g., a coil) that is magnetically coupled to the oscillator circuit 100. The Rx circuit 200 further includes an Rx front-end circuit 203 for decoding the RF signal (e.g., an OOK PWM signal) transmitted by the oscillator circuit 100. The inductive component $L_{RX}$ and the Rx front-end circuit 203 may correspond to the micro-antenna 24 and the Rx circuit 35 in FIG. 3, respectively.

The oscillator circuit 100 in FIG. 5 includes two class-D oscillators 150A and 150B stacked together (e.g., concatenated) between a supply voltage $V_{DD}$ and a reference voltage (e.g., electrical ground). Notably, a capacitor $C_S$ is coupled between a node 103A of the class-D oscillator 150A and a node 103B of the class-D oscillator 150B, and another capacitor $C_S$ is coupled between a node 105A of the class-D oscillator 150A and a node 105B of the class-D oscillator 150B. The capacitors $C_S$ ensure synchronization between the outputs of the LC tank circuits of the class-D oscillators 150A and 150B. For ease of discussion, in the context of discussion of the oscillator circuit 100, the class-D oscillators 150A and 150B may be referred to as the bottom oscillator circuit 150A and the top oscillator circuit 150B, respectively. In the illustrated embodiments, electrical components (e.g., resistors, capacitors) with the same label (e.g., R, $C_B$) have the same nominal value (e.g., same resistance, or the same capacitance).

As illustrated in FIG. 5, the bottom oscillator circuit 150A includes a first transistor $M_1$ (e.g., a CMOS transistor) and a second transistor $M_2$ (e.g., a CMOS transistor), where the gate terminal of the first transistor $M_1$ is coupled to a node 101A through a resistor R, and the gate terminal of the second transistor $M_2$ is coupled to the node 101A through another resistor R. The node 101A is configured to be supplied with (e.g., connected to) a bias voltage $V_{BIAS}$ for turning on and off the first transistor $M_1$ and the second transistor $M_2$, and therefore, the node 101A may also be referred to as a bias voltage node 101A. The source terminals of the first transistor $M_1$ and the second transistor $M_2$ are coupled to a reference voltage node 102A, which is connected to the reference voltage 104 (e.g., electrical ground).

The bottom oscillator circuit 150A of FIG. 5 further includes an LC tank circuit, which includes an inductive component $L_{TX}$ (e.g., a coil) and a capacitor $C_P$. The inductive component $L_{TX}$ (may also be referred to as a coil $L_{TX}$) is coupled between the node 103A (which is coupled to the drain terminal of the first transistor $M_1$) and the node 105A (which is coupled to the drain terminal of the second transistor $M_2$). The capacitor $C_B$ is coupled in parallel with the coil $L_{TX}$ (e.g., between the node 103A and the node 105A). In the discussion herein, the source/drain terminals of a transistor (e.g., $M_1$ or $M_2$) may be collectively referred to as the load path terminals of the transistor, and the gate terminal of the transistor may also be referred to as the control terminal of the transistor. One skilled in the art will readily appreciate that the LC tank circuit formed by the coil $L_{TX}$ and the capacitor $C_P$ generates an oscillating signal (e.g., a sinusoidal signal) with a frequency $f_{RF}$ determined by $f_{RF}=1/(2\pi\sqrt{LC})$, where L is the inductance of the coil $L_{TX}$, and C is the capacitance of the capacitor $C_P$. The frequency $f_{RF}$ of the oscillating signal generated by the LC tank circuit may be between a few hundred megahertz to a few gigahertz (e.g., between about 200 MHz and about 2 GHz), as an example. The oscillating signal may also be referred to as an oscillator signal or a frequency signal in the discussion herein. The node 103A and the node 105A may also be collectively referred to as the outputs, output ports, or output terminals of the oscillator circuit 150A.

As illustrated in FIG. 5, the bottom oscillator circuit 150A further includes a capacitor $C_B$ coupled between the gate terminal of the first transistor $M_1$ and the node 105A, and includes another capacitor $C_B$ coupled between the gate terminal of the second transistor $M_2$ and the node 103A. In some embodiments, the capacitance of the capacitor $C_B$ is smaller than the capacitance of the capacitor CF, and the inductance of the inductive component $L_{RX}$ is larger than the inductance of the inductive component $L_{TX}$.

Still referring to FIG. 5, the top oscillator circuit 150B has the same structure (e.g., equivalent schematic view) as the bottom oscillator circuit 150A, thus details are not repeated. The transistors of the top oscillator circuit 150B are labeled as transistors $M_3$ and $M_4$. In some embodiments, the transistors (e.g., $M_1$, $M_2$, $M_3$, and $M_4$) in the top oscillator circuit 150B and the bottom oscillator circuit 150A are the same. For ease of discussion, the top oscillator circuit 150B and the bottom oscillator circuit 150A may be collectively referred to as oscillator circuits iso. Note that in FIG. 5, the reference voltage node 102A of the bottom oscillator circuit 150A is coupled to electrical ground, and the reference voltage node 102B of the top oscillator circuit 150B is coupled to a center tap of the coil $L_{TX}$ of the bottom oscillator circuit 150A. In addition, a center tap of the coil $L_{TX}$ of the top oscillator circuit 150B is coupled to a voltage supply node 106 connected to a supply voltage $V_{DD}$ (e.g., a +5V supply voltage). Due to its center tap, the coil $L_{TX}$ in each of the oscillator circuits 150 may be described as comprising a first coil $L_{TX1}$ (e.g., the portion of the coil $L_{TX}$ to the left of the center tap) and a second coil $L_{TX2}$ (e.g., the portion of the coil $L_{TX}$ to the right of the center tap).

The capacitors $C_S$ in FIG. 5 coupled between respective output ports of the top oscillator circuit 150B and the bottom oscillator circuit 150A synchronize the oscillator signals generated by the top oscillator circuit 150B and the bottom oscillator circuit 150A. In other words, the frequency and the phase of the oscillator signal generated by the top oscillator circuit 150B are synchronized with those of the oscillator signal generated by the bottom oscillator circuit 150A.

The bias voltage $V_{BIAS}$ applied at the bias voltage node 101A of the bottom oscillator circuit 150A is used to turn on and off the first transistors $M_1$ and the second transistor $M_2$, which in turn turns on and off the bottom oscillator circuit 150A. For example, if the bias voltage $V_{BIAS}$ is high (e.g., above a turn-on voltage for the first transistors $M_1$ and the second transistor $M_2$), the first transistors $M_1$ and the second transistor $M_2$ are turned on, and the bottom oscillator circuit 150A generates the oscillator signal. Similarly, if the voltage VBIAS is low (e.g., below the turn-on voltage for the first transistors $M_1$ and the second transistor $M_2$), the first transistors $M_1$ and the second transistor $M_2$ are turned off, and no oscillator signal is generated by the bottom oscillator circuit 150A. The duration of high voltage for the bias voltage $V_{BIAS}$ can be controlled to generate oscillator signals with different durations of T1 and T2 (see FIG. 4).

Control of the top oscillator circuit 150B is achieved similarly, by changing a bias voltage $V_{BIAS2}$ applied at the bias voltage node loth of the top oscillator circuit 150B. In the example of FIG. 5, the bias voltage $V_{BIAS2}$ is equivalent to the sum of the bias voltage $V_{BIAS}$ and half of the supply voltage VDD (e.g., $V_{BIAS2}=V_{BIAS}+V_{DD}/2$), such that the oscillator circuits 150 are turned on and off synchronously (e.g., at the same time).

FIG. 5 further illustrates the magnetic coupling factor k between the coils $L_{TX}$ of the oscillator circuits 150 and the coil $L_{RX}$ of the Rx circuit 200. In other words, the received RF voltage at the coil $L_{RX}$ includes contributions from the coil $L_{TX}$ of the bottom oscillator circuit 150A and the coil $L_{TX}$ of the top oscillator circuit 150B. The magnetic coupling factor k may be in a range, e.g., between about $1\times10^{-3}$ and about $4\times10^{-3}$. In addition, FIG. 5 illustrates the parasitic magnetic coupling factor kp between the coils $L_{TX}$ of the bottom oscillator circuit 150A and the top oscillator circuit 150B. The parasitic magnetic coupling factor kp is larger (e.g., an order of magnitude larger or more) than the magnetic coupling factor k, and may be in a range between, e.g., about $10\times10^{-3}$ and about $100\times10^{-3}$, as an example. The parasitic magnetic coupling may reduce the combined RF signal level at the coil $L_{RX}$ of the Rx circuit 200, and therefore, should be minimized or reduced below a threshold. In some embodiments, the voltage of the received RF voltage $V_{RX}$ across the terminals of the coil $L_{RX}$ is given by:

$$\left|\frac{V_{RX}}{V_{TX}}\right| = \frac{2k \cdot G}{1+k_P},$$

$$\text{where } G = \sqrt{\frac{L_{RX}}{L_{TX}}},$$

k is the magnetic coupling factor, $k_P$ is the leakage magnetic coupling factor, and $V_{TX}$ is the voltage across the terminals of the coil $L_{TX}$. Note that in the equations, $L_{TX}$ and $L_{RX}$ are used to denote the inductances of the coils $L_{TX}$ and $L_{RX}$, respectively.

The disclosed oscillator circuit 100 (or 100A, 100B discussed hereinafter) provides advantages not achievable by existing oscillator circuits. To appreciate the advantages of the present disclosure, comparison is made between the presently disclosed oscillator circuit and a conventional class-D oscillator circuit, which is equivalent to using only the bottom oscillator circuit 150A (e.g., directly coupled between the supply voltage $V_{DD}$ and the electrical ground) as the oscillator circuit. The oscillation amplitude (e.g., amplitude of the oscillator signal) of the conventional class-D oscillator circuit is about three times of the supply voltage $V_{DD}$. As a result, the transistors (e.g., $M_1$ and $M_2$) used in the conventional class-D oscillator circuit have to be special transistors with high breakdown voltage (BV), such as laterally-diffused metal-oxide semiconductor field-effect transistor (LDMOS FET), high-voltage MOS FET (HV-MOS FET), or GaN HEMT. These special transistors are not compatible with standard CMOS technology, and special technology may be used to form these special transistors, thereby resulting in increased manufacturing cost and time. In addition, the current consumption of the conventional class-D oscillator circuit is proportional to the oscillation amplitude, and therefore, the conventional class-D oscillator circuit suffers from high current consumption, especially when the Q-factor of the coil is low (e.g., for Bipolar-CMOS-DMOS (BCD) with conductive substrate).

In contrast, in the disclosed oscillator circuit 100, each of the oscillator circuits 150 produces half of the oscillation amplitude of the conventional class-D oscillator, and the current consumption (e.g., the current flowing between the reference voltage node 102B of the top oscillator circuit 150B and the center tap of the coil $L_{TX}$ of the bottom oscillator circuit 150A, as indicated by the arrow 111 in FIG. 5) is half of the current consumption of the conventional class-D oscillator. Therefore, the transistors $M_1$ and $M_2$ can be CMOS transistors formed using standard CMOS technology. The capacitors $C_S$ ensures frequency/phase synchronization of the oscillator signals generated by the oscillator circuits iso, and therefore, through magnetically coupling, RF voltages induced by the oscillator signals generated by the oscillator circuits 150 can be constructively added together at the coil $L_{RX}$ of the Rx circuit 200 to achieve the same received RF voltage as the conventional class-D oscillator circuit.

Figure 6:
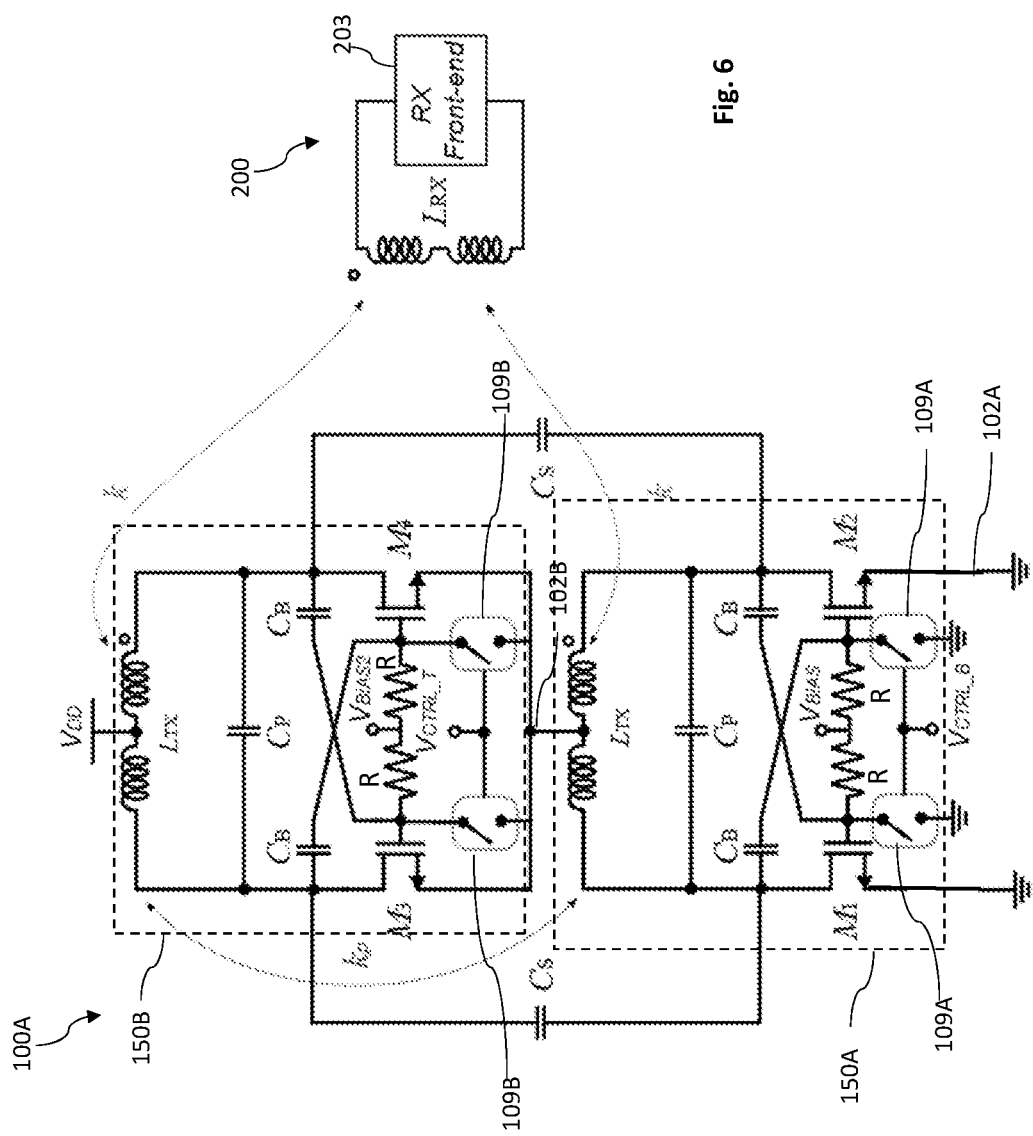
FIG. 6 is a schematic diagram of an oscillator circuit, in another embodiment.

FIG. 6 is a schematic diagram of an oscillator circuit 100A, in another embodiment. The oscillator circuit 100A is similar to the oscillator circuit 100 of FIG. 5, but with controllable switches 109A (or 109B) (e.g., transistors) added between the gate terminals of the transistors (e.g., $M_1$ and $M_2$, or $M_3$ and $M_4$) and the reference voltage node 102A (or 102B) of each of the oscillator circuits 150. In addition, during operation, the bias voltage $V_{BIAS}$ supplied to the bottom oscillator circuit 150A and the bias voltage $V_{BIAS2}$ supplied to the top oscillator circuit 150B are constant voltages corresponding to the respective turn-on voltages for the transistors ((e.g., $M_1$ and $M_2$, or $M_3$ and $M_4$). A control voltage $V_{CTRL\_B}$ is coupled to the controllable switches 109A of the bottom oscillator circuit 150A and is used to open or close the controllable switches 109A of the bottom oscillator circuit 150A. Similarly, a control voltage $V_{CTRL\_T}$ is coupled to the controllable switches 109B of the top oscillator circuit 150B and is used to open or close the controllable switches 109B of the top oscillator circuit 150B. For example, when the control voltage $V_{CTRL\_B}$ is high, the controllable switches 109A of the bottom oscillator circuit 150A are closed, and the gate voltages of the transistors $M_1$ and $M_2$ are pulled down to the electrical ground, thereby turning off the transistors $M_1$ and $M_2$. Conversely, when the control voltage $V_{CTRL\_B}$ is low, the controllable switches 109A of the bottom oscillator circuit 150A are open, and the gate voltages of the transistors $M_1$ and $M_2$ are pulled up to the bias voltage $V_{BIAS}$, thereby turning on the transistors $M_1$ and $M_2$. Therefore, instead of switching the bias voltages (e.g., $V_{BIAS}$ and $V_{BIAS2}$) between a high value and a lower value during operation (as in the operation of the oscillator circuit wo), the control voltages $V_{CTRL\_B}$ and $V_{CTRL\_T}$ are switched between a high value and a lower value in the operation of the oscillator circuit 100A, in order to generate the OOK PWM signals.

Modifications to the disclose embodiments are possible and are fully intended to be included within the scope of the present disclosure. For example, if compatible with the biasing point (e.g., when the voltages at the drain terminals of transistors $M_3$ and $M_4$ are equal to the desired bias voltage $V_{BIAS2}$, which is substantially equal to $V_{DD}$), the top oscillator circuit 150B may be connected in a self-biasing configuration by removing the bias voltage $V_{BIAS2}$, the resistors R, and the capacitors $C_B$, and by using a direct cross-connection of the gate terminals and the drain terminals of the transistors $M_3$ and $M_4$. In other words, in the self-biasing configuration, the gate terminal of the transistor $M_3$ is directly coupled to the drain terminal of the transistor $M_4$, and the gate terminal of the transistor $M_4$ is directly coupled to the drain terminal of the transistor $M_3$. The self-biasing configuration may be used to reduce the turn-on time and the turn-off time of the oscillator circuit 100A. As another example, the top oscillator circuit 150B may be turned on and off by using only the controllable switches 109A in the bottom oscillator circuit 150A, with the switches 109B, the resistors R of the top oscillator circuit 150B, and the capacitor $C_B$ of the top oscillator circuit 150B removed, if biasing quiescent points are compatible in the adopted implementation.

Figure 7:
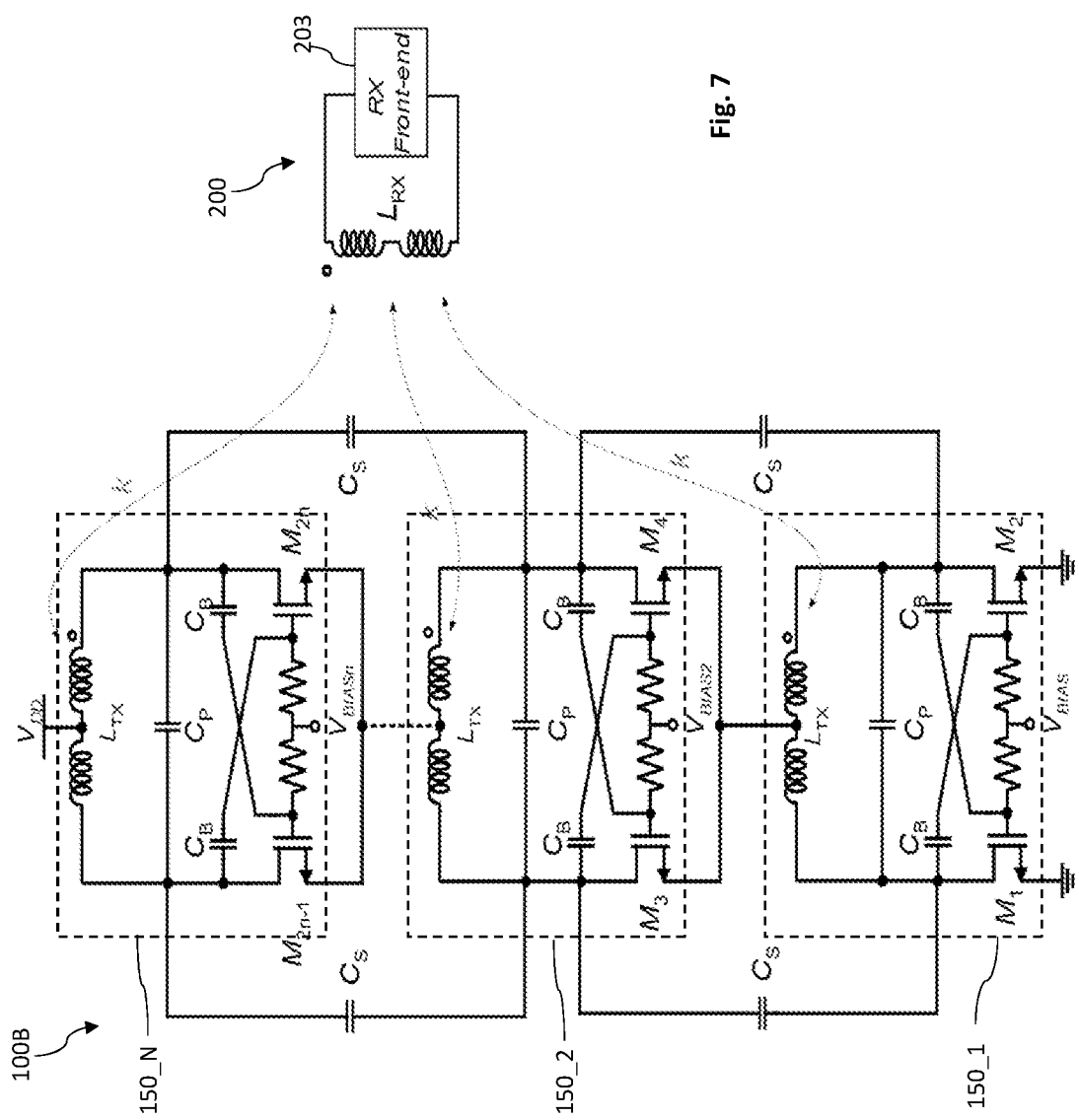
FIG. 7 is a schematic diagram of an oscillator circuit, in yet another embodiment.

FIG. 7 is a schematic diagram of an oscillator circuit 100B, in yet another embodiment. The oscillator circuit 100B is a generalization of the oscillator circuit 100 in FIG. 5. In particular, N conventional class-D oscillator circuits, labeled as 150_1, 150_2, . . . , and 150_N, are stacked together between a supply voltage $V_{DD}$ and a reference voltage (e.g., electrical ground). In the illustrated embodiment, the class-D oscillator circuits 150_1 through 150_N are identical. Similar to FIG. 5, capacitors $C_S$ are coupled between corresponding output ports of two adjacent (e.g., immediately adjacent) class-D oscillator circuits 150_i and 150_(i+1), where i=1, 2, . . . , N−1. The capacitive coupling provided by the capacitors $C_S$ ensures frequency/phase synchronization between the oscillator signals generated by all the class-D oscillator circuits 150_1, 150_2, . . . , and 150_N. The bias voltage for the i-th class-D oscillator circuit 150_i is given by:

$$V_{BIASi} = V_{BIAS} + \frac{(i-1)V_{DD}}{N},$$

where i=1, 2, . . . , N.

The oscillation amplitude of each of the oscillator circuits 150_1, 150_2, . . . , and 150_N of the oscillator circuit 100B is 1/N of the oscillation amplitude of a reference design, where only one conventional class-D oscillator circuit is used to generate the transmitted RF signal, and the current consumption of the oscillator circuit 100B is 1/N of that of the reference design. The reduced oscillation amplitude allows transistors with very low breakdown voltages (e.g., nanometer CMOS) to be used. Using transistors with lower breakdown voltage (hence higher transition frequency ft) allows increasing the oscillation frequency, which allows for better data rate or multi-channel capability. Note that due to the frequency/phase synchronization between the oscillator signals generated by all the oscillator circuits 150_1, 150_2, ..., and 150_N, the contribution from all oscillator circuits 150_1, 150_2, ..., and 150_N can be constructively added together at the coil $L_{RX}$ of the Rx circuit 200 to generate the received RF signal, and therefore, the received RF signal voltage at the coil $L_{RX}$ is substantially the same (assuming little or no parasitic magnetic coupling) as the conventional class-D oscillator circuit. In some embodiments, the received RF signal voltage at the coil $L_{RX}$ is given by:

$$\left|\frac{V_{RX}}{V_{TX}}\right|_{OC} = NkG,$$

$$\text{where } G = \sqrt{\frac{L_{RX}}{L_{TX}}},$$

k is the magnetic coupling factor, N is the number of stacked class-D oscillators, and the notation "OC" in the equations indicates that the above equations assume pure capacitive coupling (e.g., no leakage magnetic coupling) between the coils of the stacked oscillator circuits 150_1, 150_2, ..., and 150_N.

FIG. 8 illustrates a cross-sectional view of a semiconductor chip 50, in an embodiment. The semiconductor chip 50 may be the chip 21 or 23 in FIG. 3. In the example of FIG. 8, micro-antennas (labeled as 63A and 63B) are formed in the upper dielectric layer(s) 53 of the semiconductor chip 50 in the back-end-of line (BEOL) processing of semiconductor manufacturing.

Figure 9:
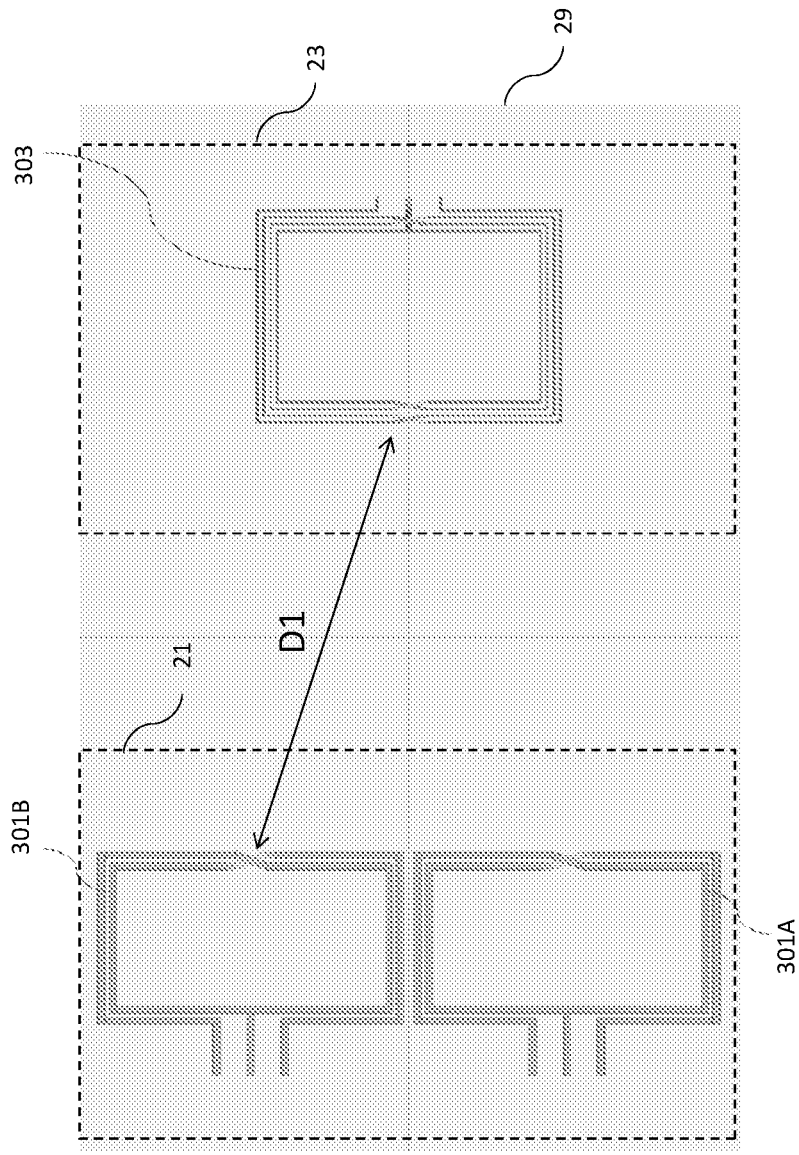
FIG. 9 illustrates a top view of the micro-antennas used in the semiconductor package of FIG. 2, in an embodiment.
Figure 10:
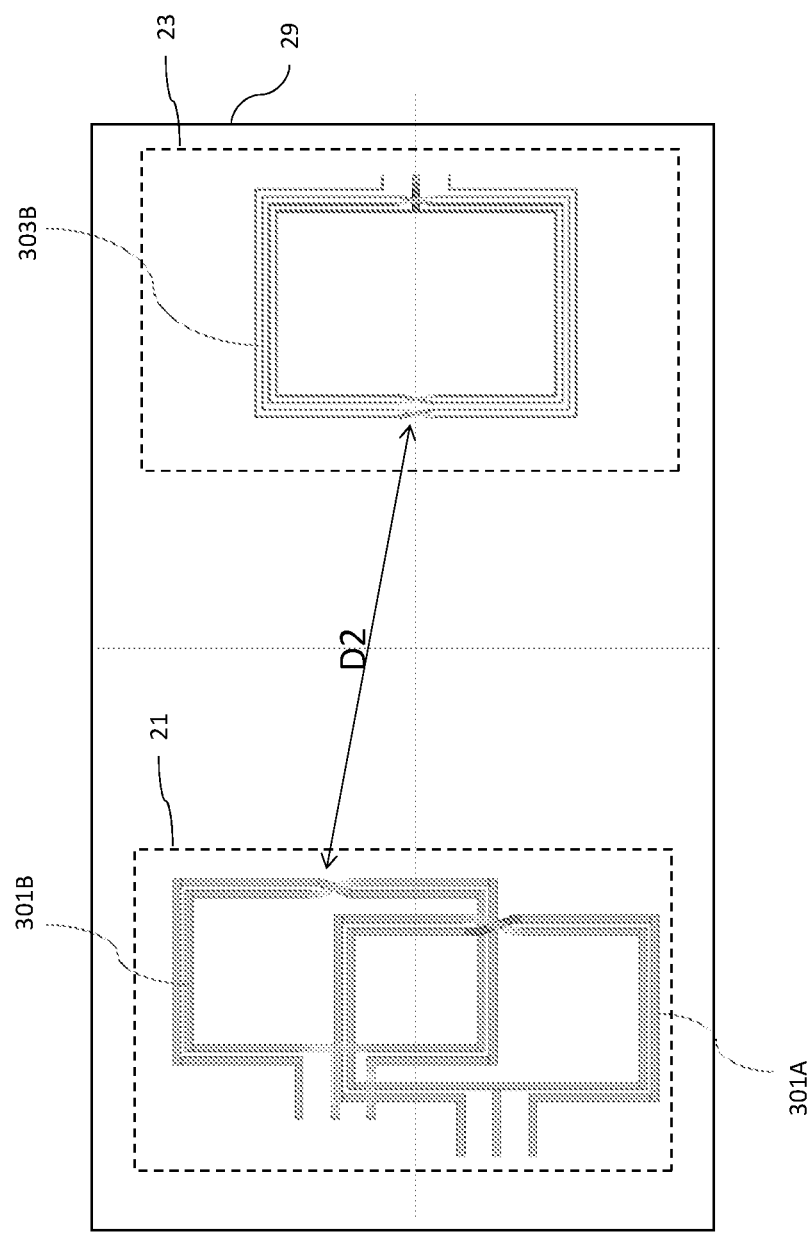
FIG. 10 illustrates a top view of the micro-antennas used in the semiconductor package of FIG. 2, in another embodiment.

Referring to FIG. 8, the semiconductor chip 50 includes a substrate 51 (e.g., a silicon substrate). Electrical components 52, such as transistors, resistors, or the like, are formed on or in the substrate 51. Interconnect structures, which include dielectric layers 53 (e.g., silicon oxide) and conductive features (e.g., conductive lines 55 and vias 57) formed in the dielectric layers 53, are formed over the substrate 51 to interconnect the electrical components 52 to form functional circuits. In some embodiments, etch stop layers 59 (e.g., silicon nitride) are formed between some of the dielectric layers 53. FIG. 8 further illustrates a conductive pad 61 (e.g., a copper pad) at a topmost dielectric layer 53, and one or more micro-antennas 63A and 63B (e.g., coils) formed within the dielectric layer 53. The micro-antennas 63A and 63B may be formed as circular-shaped copper patterns in one or more upper dielectric layers 53, as an example. Example top views of the micro-antennas 63A and 63B are shown in FIGS. 9 and 10. FIG. 8 further illustrates a passivation layer 65 (e.g., a polymer layer) formed over the topmost dielectric layer 53, and under-bump metallurgy (UBM) structures 67 formed over the conductive pads 61. Conductive connectors, such as copper pillars, solder balls, combinations thereof, or the like, may be formed over the UMB structures 67 for connection to other devices.

FIG. 9 illustrates a top view of the micro-antennas used in the semiconductor package 20 of FIG. 2, in an embodiment. For simplicity, not all features of the semiconductor package 20 are illustrated in FIG. 9. FIG. 9 shows micro-antennas 301A, 301B, and 303, and the molding compound 29. The micro-antennas 301A and 301B may correspond to, e.g., the coils $L_{TX}$ of the oscillator circuit 100 of FIG. 5, and may be formed within, e.g., one or more upper dielectric layers 53 of the chip 21. The boundaries (e.g., sidewalls) of the chip 21 are illustrated in dashed lines in FIG. 9. The micro-antenna 303 may correspond to, e.g., the coil $L_{RX}$ in the Rx circuit 200 of FIG. 5, and may be formed within, e.g., the upper dielectric layers 53 of the chip 23. The boundaries (e.g., sidewalls) of the chip 23 are also illustrated in dashed lines in FIG. 9.

The micro-antennas 301A and 301B in FIG. 9 are placed side-by-side (e.g., without overlapping) with a distance in-between to reduce the parasitic magnetic coupling between the micro-antennas 301A, 301B (e.g., coils). The design (e.g., the placement) of the micro-antennas 301A and 301B in FIG. 9, however, requires a larger silicon surface area than the design in FIG. 10.

FIG. 10 illustrates a top view of the micro-antennas used in the semiconductor package 20 of FIG. 2, in another embodiment. In FIG. 10, the micro-antennas 301A and 301B overlap in the top view. In some embodiments, the micro-antennas 301A and 301B are formed within different upper dielectric layers 53 of the chip 21 to avoid direct contact between the micro-antennas 301A and 301B. The overlapping design in FIG. 10 may results in increased parasitic magnetic coupling between the micro-antennas 301A and 301B, but has the advantage of requiring less silicon surface area for the chip 21. One skilled in the art will readily appreciate that other designs for the micro-antennas 301A, 301B, and 303 are possible, with different trade-offs between parasitic magnetic coupling, silicon area, and magnetic coupling. These and other variations are fully intended to be included within the scope of the present disclosure.

Disclosed embodiments may achieve advantages. The disclosed embodiments form oscillator circuits by stacking multiple class-D oscillator circuits and using capacitive coupling (e.g., capacitor $C_S$) between adjacent class-D oscillator circuits for frequency/phase synchronization. The disclosed oscillator circuits reduce the oscillation amplitude for each of the stacked class-D oscillator circuits, and reduce the current consumption of the oscillator circuit. As a result, CMOS transistor formed using standard CMOS technology can be used in the disclosed oscillator circuits, which saves manufacturing cost and time, and may achieve better system performance, e.g., in terms of higher data rate and better multi-channel capability.

Example embodiments of the present invention are summarized here. Other embodiments can also be understood from the entirety of the specification and the claims filed herein.

Example 1. In an embodiment, an apparatus includes a first oscillator circuit and a second oscillator circuit. The first oscillator circuit comprises: a first transistor and a second transistor, wherein a gate terminal of the first transistor and a gate terminal of the second transistor are coupled to a first node, wherein a first load path terminal of the first transistor and a first load path terminal of the second transistor are coupled to a reference voltage node; a first coil coupled between a second load path terminal of the first transistor and a second load path terminal of the second transistor; and a first capacitor coupled in parallel with the first coil. The second oscillator circuit comprises: a third transistor and a fourth transistor, wherein a gate terminal of the third transistor and a gate terminal of the fourth transistor are coupled to a second node, wherein a first load path terminal of the third transistor and a first load path terminal of the fourth transistor are coupled to a center tap of the first coil; a second coil coupled between a second load path terminal of the third transistor and a second load path terminal of the fourth transistor; and a second capacitor coupled in parallel with the second coil. The apparatus further includes: a third capacitor coupled between the second load path terminal of the first transistor and the second load path terminal of the third transistor; and a fourth capacitor coupled between the second load path terminal of the second transistor and the second load path terminal of the fourth transistor.

Example 2. The apparatus of Example 1, wherein the first node is configured to receive a first bias voltage for the first transistor and the second transistor, and the second node is configured to receive a second bias voltage for the third transistor and the fourth transistor.

Example 3. The apparatus of Example 2, wherein the second bias voltage is higher than the first bias voltage.

Example 4. The apparatus of Example 1, wherein a center tap of the second coil is coupled to a supply voltage node.

Example 5. The apparatus of Example 1, wherein the first oscillator circuit further comprises: a first resistor coupled between the first node and the gate terminal of the first transistor; and a second resistor coupled between the first node and the gate terminal of the second transistor.

Example 6. The apparatus of Example 5, wherein the first oscillator circuit further comprises: a fifth capacitor coupled between the gate terminal of the first transistor and the second load path terminal of the second transistor; and a sixth capacitor coupled between the gate terminal of the second transistor and the second load path terminal of the first transistor.

Example 7. The apparatus of Example 6, wherein the second oscillator circuit further comprises: a third resistor coupled between the second node and the gate terminal of the third transistor; and a fourth resistor coupled between the second node and the gate terminal of the fourth transistor.

Example 8. The apparatus of Example 7, wherein the second oscillator circuit further comprises: a seventh capacitor coupled between the gate terminal of the third transistor and the second load path terminal of the fourth transistor; and an eighth capacitor coupled between the gate terminal of the fourth transistor and the second load path terminal of the third transistor.

Example 9. The apparatus of Example 1, wherein the first coil and the first capacitor form a first LC tank circuit configured to generate a first oscillator signal, wherein the second coil and the second capacitor form a second LC tank circuit configured to generate a second oscillator signal.

Example 10. The apparatus of Example 9, wherein the first oscillator signal and the second oscillator signal have a same oscillating frequency and a same phase.

Example 11. The apparatus of Example 1, further comprising: a third coil, wherein the third coil is electromagnetically coupled to the first coil and the second coil; and a radio frequency (RF) circuit coupled to the third coil.

Example 12. In an embodiment, a device includes a first oscillator circuit and a second oscillator circuit concatenated with the first oscillator circuit, wherein the first oscillator circuit and the second oscillator circuit are configured to be coupled between a supply voltage and an electrical ground, wherein each of the first oscillator circuit and the second oscillator circuit is a class-D oscillator circuit, wherein the class-D oscillator circuit comprises: a first transistor coupled between a reference voltage node of the class-D oscillator circuit and a first output of the class-D oscillator circuit; a second transistor coupled between the reference voltage node of the class-D oscillator circuit and a second output of the class-D oscillator circuit, wherein a gate terminal of the first transistor and a gate terminal of the second transistor are coupled to a bias voltage node of the class-D oscillator circuit; a first coil coupled between the first output and the second output of the class-D oscillator circuit; and a first capacitor coupled in parallel with the first coil. The device further includes: a second capacitor coupled between the first output of the first oscillator circuit and the first output of the second oscillator circuit; and a third capacitor coupled between the second output of the first oscillator circuit and the second output of the second oscillator circuit.

Example 13. The device of Example 12, wherein the first coil and the first capacitor of the first oscillator circuit are configured to form a first LC tank circuit, wherein the first coil and the first capacitor of the second oscillator circuit are configured to form a second LC tank circuit, wherein the first LC tank circuit is configured to generate a first oscillator signal, and the second LC tank circuit is configured to generate a second oscillator signal, wherein the first oscillator signal and the second oscillator signal have a same frequency and a same phase.

Example 14. The device of Example 12, wherein the reference voltage node of the first oscillator circuit is configured to be coupled to the electrical ground, wherein the reference voltage node of the second oscillator circuit is coupled to a center tap of the first coil of the first oscillator circuit, wherein a center tap of the first coil of the second oscillator circuit is configured to be coupled to the supply voltage.

Example 15. The device of Example 12, wherein the bias voltage node of the first oscillator circuit is configured to be supplied with a first bias voltage, wherein the bias voltage node of the second oscillator circuit is configured to be supplied with a second bias voltage higher than the first bias voltage.

Example 16. The device of Example 12, wherein the class-D oscillator circuit further comprises: a first resistor coupled between the bias voltage node and a gate terminal of the first transistor; and a second resistor coupled between the bias voltage node and a gate terminal of the second transistor.

Example 17. The device of Example 16, wherein the class-D oscillator circuit further comprises: a fourth capacitor coupled between the gate terminal of the first transistor and the second output of the class-D oscillator circuit; and a fifth capacitor coupled between the gate terminal of the second transistor and the first output of the class-D oscillator circuit.

Example 18. In an embodiment, an integrated circuit (IC) device includes a first oscillator circuit that comprises: a first transistor and a second transistor, wherein a gate terminal of the first transistor is coupled to a first node through a first resistor, and a gate terminal of the second transistor is coupled to the first node through a second resistor; a first capacitor coupled between a drain terminal of the first transistor and a drain terminal of the second transistor; and a first coil coupled in parallel with the first capacitor. The IC device further includes a second oscillator circuit, wherein the second oscillator circuit is identical to the first oscillator circuit, wherein a source terminal of the first transistor of the first oscillator circuit and a source terminal of the second transistor of the first oscillator circuit are coupled to a reference voltage node, wherein a source terminal of the first transistor of the second oscillator circuit and a source terminal of the second transistor of the second oscillator circuit are coupled to a center tap of the first coil of the first oscillator circuit, wherein a center tap of the first coil of the second oscillator circuit is coupled to a supply voltage node. The IC device further includes: a second capacitor coupled between the drain terminal of the first transistor of the first oscillator circuit and the drain terminal of the first transistor of the second oscillator circuit; and a third capacitor coupled between the drain terminal of the second transistor of the first oscillator circuit and the drain terminal of the second transistor of the second oscillator circuit.

Example 19. The IC device of Example 18, wherein the first node of the first oscillator circuit is configured to be supplied with a first bias voltage, and the first node of the second oscillator circuit is configured to be supplied with a second bias voltage higher than the first bias voltage.

Example 20. The IC device of Example 18, wherein the first oscillator circuit further comprises: a fourth capacitor coupled between the gate terminal of the first transistor and the drain terminal of the second transistor; and a fifth capacitor coupled between the gate terminal of the second transistor and the drain terminal of the first transistor.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An apparatus comprising:
   a first oscillator circuit comprising:
      a first transistor and a second transistor, wherein a gate terminal of the first transistor and a gate terminal of the second transistor are coupled to a first node, wherein a first load path terminal of the first transistor and a first load path terminal of the second transistor are coupled to a reference voltage node; and
      a first LC tank circuit comprising:
         a first capacitor coupled between a second load path terminal of the first transistor and a second load path terminal of the second transistor; and
         a first coil coupled in parallel with the first capacitor;
   a second oscillator circuit comprising:
      a third transistor and a fourth transistor, wherein a gate terminal of the third transistor and a gate terminal of the fourth transistor are coupled to a second node, wherein a first load path terminal of the third transistor and a first load path terminal of the fourth transistor are coupled to a center tap of the first coil; and
      a second LC tank circuit comprising:
         a second capacitor coupled between a second load path terminal of the third transistor and a second load path terminal of the fourth transistor; and
         a second coil coupled in parallel with the second capacitor, wherein a center tap of the second coil is coupled to a supply voltage node;
   a third capacitor coupled between the second load path terminal of the first transistor and the second load path terminal of the third transistor; and
   a fourth capacitor coupled between the second load path terminal of the second transistor and the second load path terminal of the fourth transistor.

2. The apparatus of claim 1, further comprising:
   a first controllable switch coupled between the gate terminal of the first transistor and the reference voltage node; and
   a second controllable switch coupled between the gate terminal of the second transistor and the reference voltage node.

3. The apparatus of claim 2, wherein the first node is configured to receive a first bias voltage for the first transistor and the second transistor, wherein the first bias voltage has a first fixed value.

4. The apparatus of claim 3, wherein the first transistor and the second transistor are configured to be turned ON by opening the first controllable switch and the second controllable switch, wherein the first transistor and the second transistor are configured to be turned OFF by closing the first controllable switch and the second controllable switch.

5. The apparatus of claim 4, further comprising:
   a third controllable switch coupled between the gate terminal of the third transistor and the center tap of the first coil; and
   a fourth controllable switch coupled between the gate terminal of the fourth transistor and the center tap of the first coil.

6. The apparatus of claim 5, wherein the second node is configured to receive a second bias voltage for the third transistor and the fourth transistor, wherein the second bias voltage has a second fixed value higher than the first fixed value.

7. The apparatus of claim 6, wherein the third transistor and the fourth transistor are configured to be turned ON by opening the third controllable switch and the fourth controllable switch, wherein the third transistor and the fourth transistor are configured to be turned OFF by closing the third controllable switch and the fourth controllable switch.

8. The apparatus of claim 7, wherein the first controllable switch, the second controllable switch, the third controllable switch, and the fourth controllable switch are configured to be turned ON and OFF at the same time.

9. The apparatus of claim 1, wherein the first oscillator circuit further comprises:
   a first resistor coupled between the first node and the gate terminal of the first transistor;
   a second resistor coupled between the first node and the gate terminal of the second transistor;
   a fifth capacitor coupled between the gate terminal of the first transistor and the second load path terminal of the second transistor; and
   a sixth capacitor coupled between the gate terminal of the second transistor and the second load path terminal of the first transistor.

10. The apparatus of claim 9, wherein the second oscillator circuit further comprises:
    a third resistor coupled between the second node and the gate terminal of the third transistor;
    a fourth resistor coupled between the second node and the gate terminal of the fourth transistor;
    a seventh capacitor coupled between the gate terminal of the third transistor and the second load path terminal of the fourth transistor; and
    an eighth capacitor coupled between the gate terminal of the fourth transistor and the second load path terminal of the third transistor.

11. A device comprising:
    a first oscillator circuit;
    a second oscillator circuit concatenated with the first oscillator circuit, wherein the first oscillator circuit and the second oscillator circuit are configured to be coupled between a supply voltage and an electrical ground, wherein each of the first oscillator circuit and the second oscillator circuit is a class-D oscillator circuit, wherein the class-D oscillator circuit comprises:

a first transistor coupled between a reference voltage node of the class-D oscillator circuit and a first output of the class-D oscillator circuit;

a second transistor coupled between the reference voltage node of the class-D oscillator circuit and a second output of the class-D oscillator circuit, wherein a gate terminal of the first transistor and a gate terminal of the second transistor are coupled to a bias voltage node of the class-D oscillator circuit; and an LC tank circuit comprising:

a first capacitor coupled between the first output and the second output of the class-D oscillator circuit; and a first coil coupled in parallel with the first capacitor; and a second capacitor coupled between the first output of the first oscillator circuit and the first output of the second oscillator circuit; and a third capacitor coupled between the second output of the first oscillator circuit and the second output of the second oscillator circuit, wherein the bias voltage node of the first oscillator circuit is configured to be supplied with a first bias voltage, wherein the bias voltage node of the second oscillator circuit is configured to be supplied with a second bias voltage higher than the first bias voltage.

12. The device of claim 11, wherein the LC tank circuit of the first oscillator circuit is configured to generate a first oscillator signal, and the LC tank circuit of the second oscillator circuit is configured to generate a second oscillator signal, wherein the first oscillator signal and the second oscillator signal have a same frequency and a same phase.

13. The device of claim 11, wherein the reference voltage node of the first oscillator circuit is configured to be coupled to the electrical ground, wherein the reference voltage node of the second oscillator circuit is coupled to a center tap of the first coil of the first oscillator circuit, wherein a center tap of the first coil of the second oscillator circuit is configured to be coupled to the supply voltage.

14. The device of claim 11, wherein the first bias voltage and the second bias voltage have respective fixed values, wherein the class-D oscillator circuit further comprises:

a first controllable switch coupled between the gate terminal of the first transistor and the reference voltage node; and a second controllable switch coupled between the gate terminal of the second transistor and the reference voltage node, wherein the first transistor and the second transistor are configured to be turned ON or OFF by opening or closing the first controllable switch and the second controllable switch.

15. An integrated circuit (IC) device comprising:

a first oscillator circuit comprising:

a first transistor and a second transistor, wherein gate terminals of the first transistor and the second transistor are coupled to a first node;

a first coil coupled between a drain terminal of the first transistor and a drain terminal of the second transistor; and a first capacitor coupled in parallel with the first coil;

a second oscillator circuit, wherein the second oscillator circuit has an identical structure as the first oscillator circuit, wherein a source terminal of the first transistor of the first oscillator circuit and a source terminal of the second transistor of the first oscillator circuit are coupled to a reference voltage node, wherein a source terminal of the first transistor of the second oscillator circuit and a source terminal of the second transistor of the second oscillator circuit are coupled to a center tap of the first coil of the first oscillator circuit, wherein a center tap of the first coil of the second oscillator circuit is coupled to a supply voltage node, wherein the first node of the first oscillator circuit is configured to be supplied with a first bias voltage, and the first node of the second oscillator circuit is configured to be supplied with a second bias voltage different from the first bias voltage;

a second capacitor coupled between the drain terminal of the first transistor of the first oscillator circuit and the drain terminal of the first transistor of the second oscillator circuit; and a third capacitor coupled between the drain terminal of the second transistor of the first oscillator circuit and the drain terminal of the second transistor of the second oscillator circuit.

16. The IC device of claim 15, wherein the first coil of the first oscillator circuit and the first coil of the second oscillator circuit comprise metal patterns in one or more dielectric layers of the IC device, wherein in a top view, the first coil of the first oscillator circuit is spaced apart from the first coil of the second oscillator circuit.

17. The IC device of claim 15, wherein the first coil of the first oscillator circuit and the first coil of the second oscillator circuit comprise metal patterns in different dielectric layers of the IC device, wherein in a top view, the first coil of the first oscillator circuit overlaps with the first coil of the second oscillator circuit.

18. The IC device of claim 15, wherein the second bias voltage is higher than the first bias voltage.

19. The apparatus of claim 1, wherein the first LC tank circuit is configured to generate a first oscillator signal, and the second LC tank circuit of the second oscillator circuit is configured to generate a second oscillator signal, wherein the first oscillator signal and the second oscillator signal have a same frequency.

20. The apparatus of claim 19, wherein the first oscillator signal and the second oscillator signal further have a same phase.

* * * * *